United States Patent [19]

Simpson et al.

[11] Patent Number: 4,869,418

[45] Date of Patent: Sep. 26, 1989

[54] SOLDER LEVELING METHOD AND APPARATUS

[75] Inventors: John P. Simpson, Apalachin, N.Y.; Gary L. Newman, Little Meadows, Pa.; James M. Larnerd, Port Crane, N.Y.; Alan J. Emerick, Warren Center, Pa.

[73] Assignee: International Business Machines Corporation, Endicott, N.Y.

[21] Appl. No.: 269,137

[22] Filed: Nov. 9, 1988

Related U.S. Application Data

[60] Division of Ser. No. 107,852, Oct. 6, 1987, Pat. No. 4,799,616, which is a continuation of Ser. No. 873,318, Jun. 11, 1986, abandoned.

[51] Int. Cl.$^4$ .............................................. B23K 3/06
[52] U.S. Cl. ..................................... 228/37; 228/40; 118/423
[58] Field of Search .......................... 228/37, 40, 19; 118/423

[56] References Cited

U.S. PATENT DOCUMENTS

| | | | |
|---|---|---|---|
| 1,716,671 | 6/1929 | Taylor | 228/37 |
| 1,739,482 | 12/1929 | Griswald | 427/347 |
| 2,267,273 | 12/1941 | Garbe | 118/57 X |
| 2,723,922 | 11/1955 | Fleming . | |
| 2,723,922 | 11/1955 | Bajka et al. | 427/97 |
| 2,821,159 | 1/1958 | Rayburn et al. . | |
| 2,986,114 | 5/1961 | Fuchs et al. | 118/686 |
| 3,058,441 | 10/1962 | Walker et al. . | |
| 4,072,777 | 2/1978 | Schoenthaler | 228/37 X |

FOREIGN PATENT DOCUMENTS 0166817 1/1986 European Pat. Off. .

*Primary Examiner*—Kenneth J. Ramsey
*Attorney, Agent, or Firm*—Perman & Green

[57] ABSTRACT

A method and apparatus for producing flush solder fill over recessed pins and over passage holes in circuitized substrates. A substrate carrying rack is immersed in a vessel of molten solder after it has been similarly immersed in a flux bath. While in the molten solder, the rack is vigorously agitated. The rack is then withdrawn from the molten solder and is pivoted upwardly while positioned over the molten solder. Simultaneously, an anvil is rotated from a home position to an impact position at precisely the correct moment. With the solder still molten on the substrate surfaces, the rack is then permitted to descend and is positively biased to strike the anvil thereby dislodging any excess molten solder. A unique supporting arrangement for the rack insures that only a minimum of mass acutally impacts against the anvil while insuring the effectiveness of the operation. Each cantilevered arm from which a rack is suspended is temporarily supported during the impacting operation after which the support member is withdrawn. Also, a solder pot of unique design and operation is provided to assure rapid, complete heating of substrates while eliminating contamination thereof by dross and oxides.

15 Claims, 15 Drawing Sheets

A  B  C

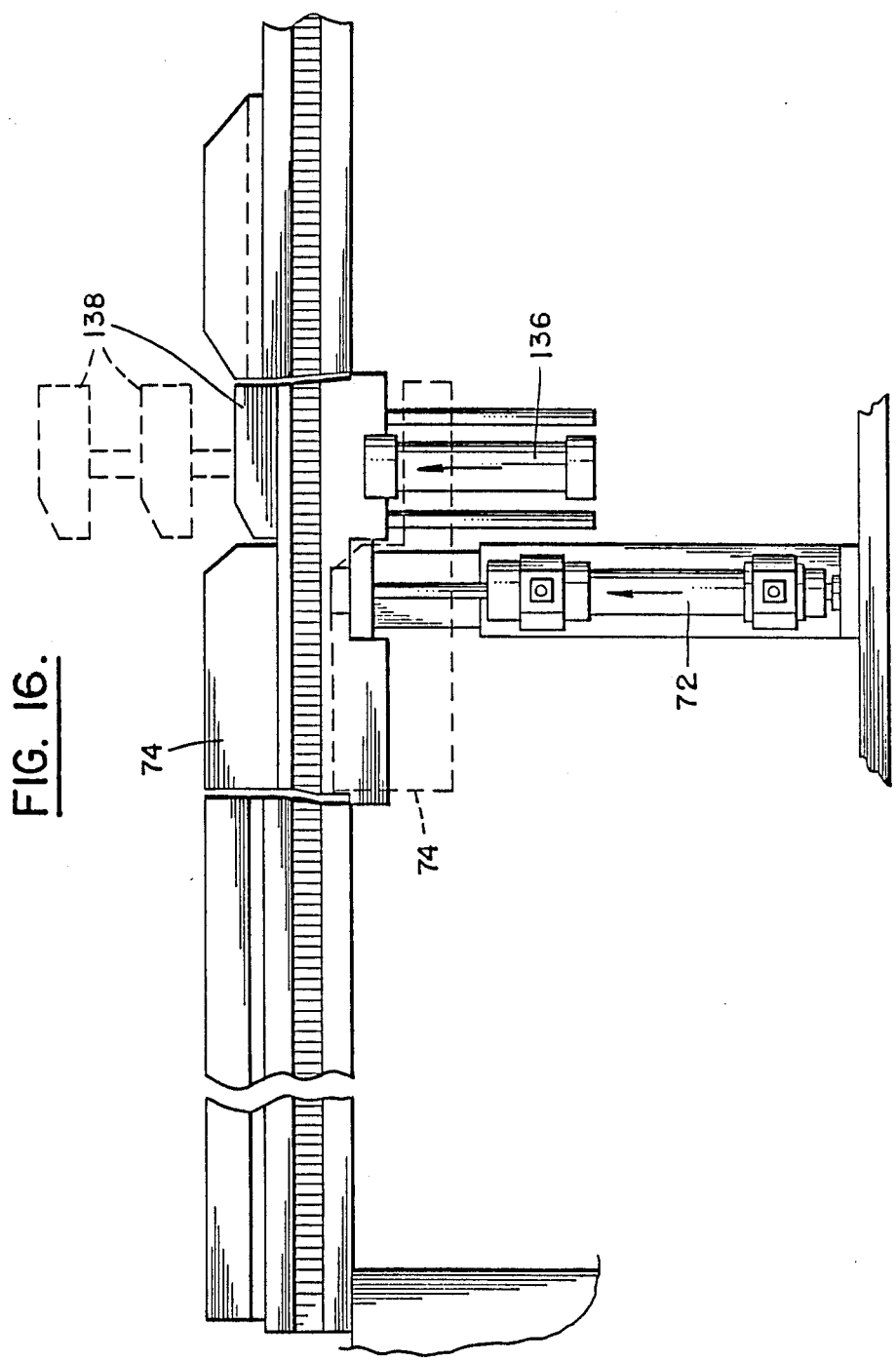

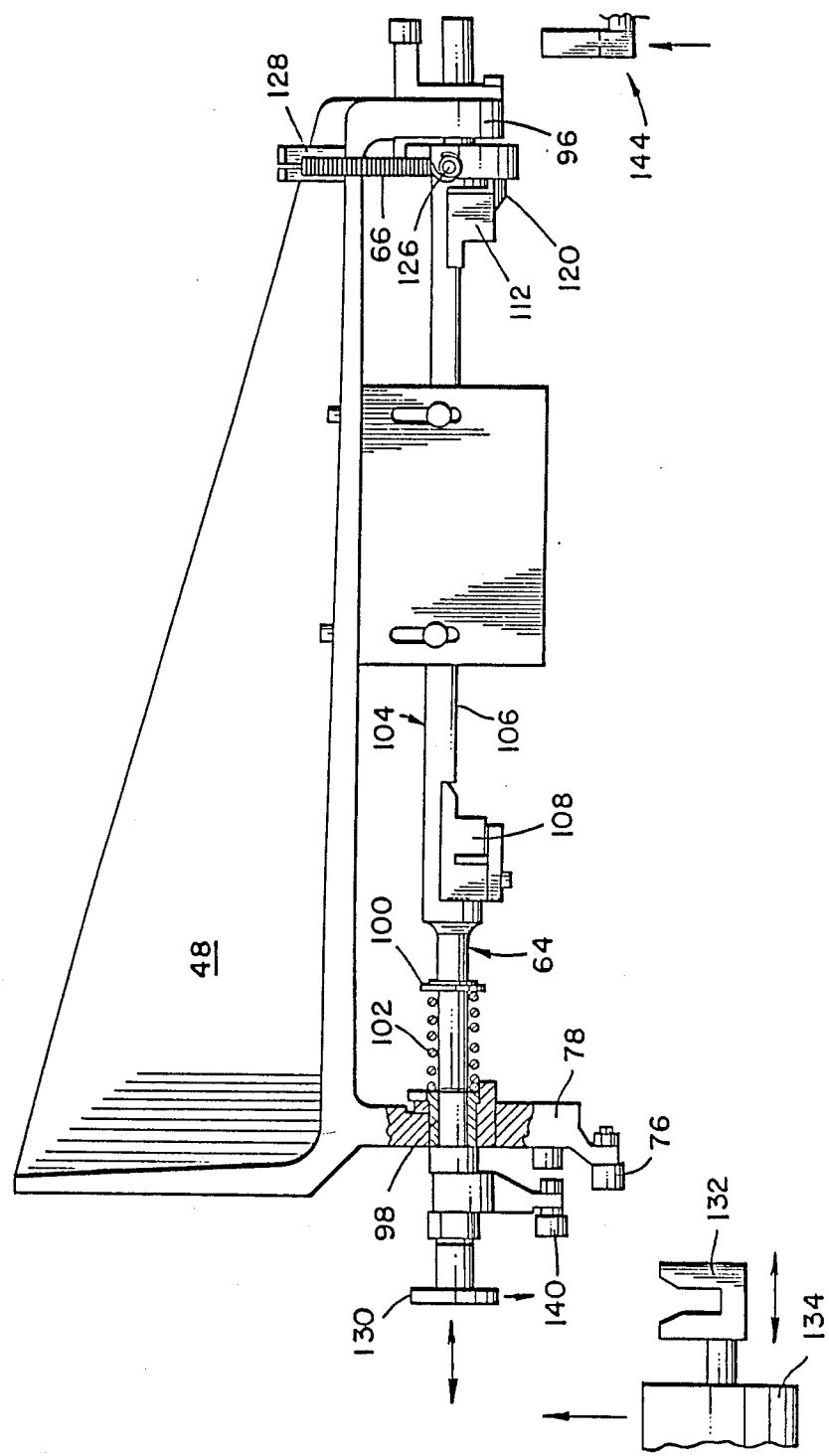

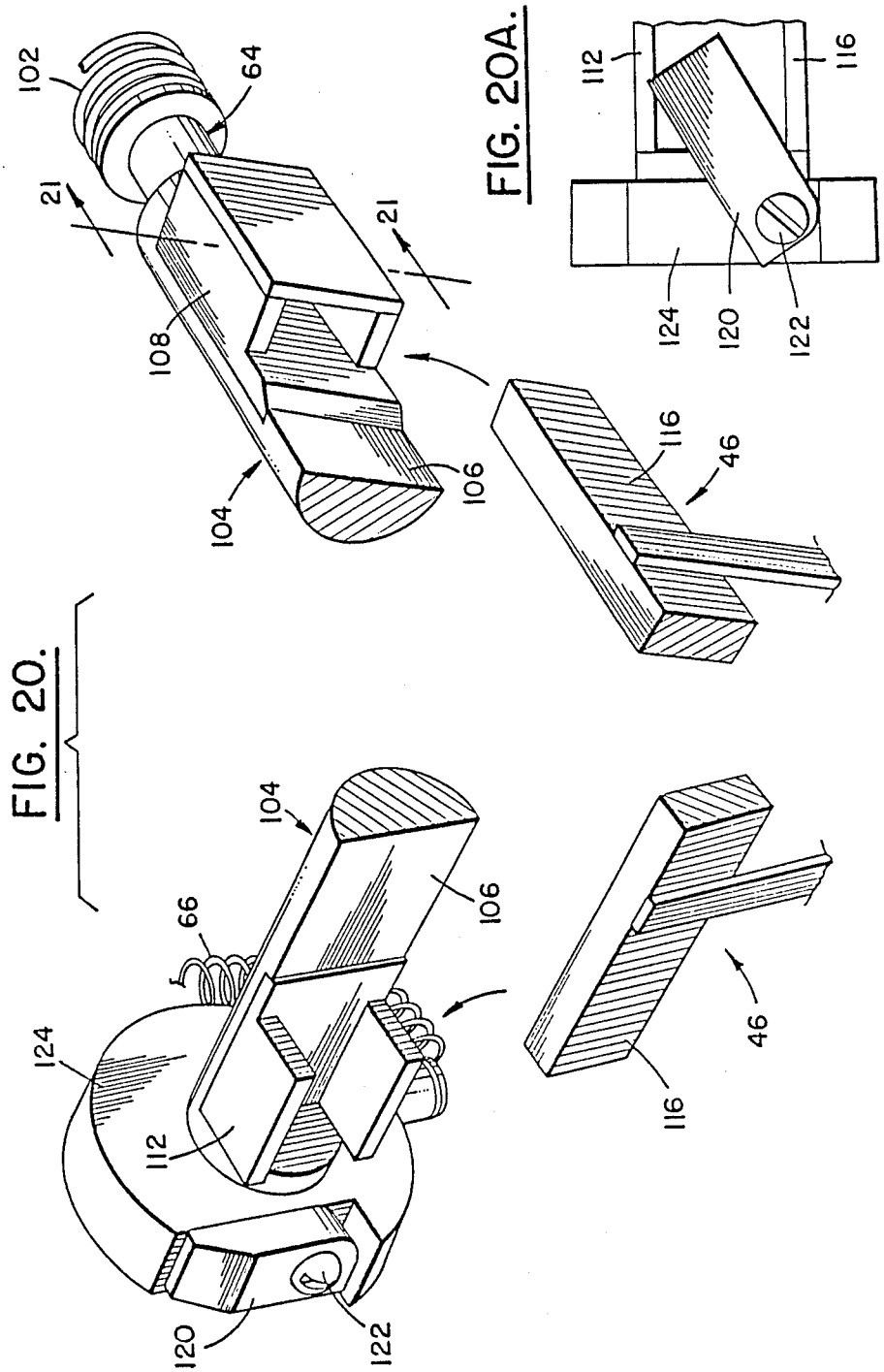

SOLDER LEVELING METHOD AND APPARATUS

This is a divisional of application Ser. No. 107,852 filed Oct. 6, 1987, now U.S. Pat. No. 4,799,616 issued Jan. 24, 1989, which in turn, is a continuation of application Ser. No. 873,318 filed June 11, 1986, now abandoned.

BACKGROUND OF THE INVENTION

I. Field of the Invention

This invention relates to a method of and apparatus for producing flush solder fill over recessed pins and over passage holes in circuitized substrate.

II. Description of the Prior Art

Various soldering systems are well known in the art for mass soldering electrical and electronic components, by their leads, onto circuitized substrates. Typically, such substrates are composed of a dielectric material such as ceramics or of a glass/polymer base composition. One technique for mass soldering components to substrates is that of dip soldering. With this technique, the entire side of a substrate containing the printing wiring, with the leads from the components projecting through apertures in the board, is engaged for a certain period of time with the surface of a bath of molten solder, and then removed. Another technique for mass soldering components onto substrates is that of wave soldering. A typical prior art wave soldering system generally comprises a container adapted to hold a supply of molten solder and a sump partially submerged in the molten solder. The sump has an intake orifice below the surface of molten solder, and an elongated horizontal nozzle or slot above the surface of the solder. A positive displacement pump is submerged in the body of solder and is adapted to force molten solder into the sump intake orifice, where the molten solder then flows upward in the sump and out the horizontal nozzle to thereby produce a smoothly rounded standing wave of molten solder above the nozzle.

Other techniques for mass soldering electrical and electronic components onto circuitized substrates are well known in the art and include cascade soldering, jet soldering and drag soldering. So-called "leadless" components such as flat packs can also be mass soldered to substrates by fixing the components to the bottom of a substrate, as by fixturing or with an adhesive, and then engaging the bottom of the substrate and the components with molten solder. While known mass soldering systems have provided substantial manufacturing economy to the electronics industry and thus achieved substantial commercial use, the deposition of excess solder on the substrate circuits, connections and leads has been a continual problem. Deposition of excess solder may result in formation of shorts, icicles and/or bridges, and will increase solder consumption and finished substrate weight. Moreover, current trends in the electronics industry to relatively high density electronic assemblies has increased the problem of solder shorts, icicling and bridging.

The prior art has devised various techniques to solve the problems of solder shorts, icicling and bridging. For example, for wave soldering, one technique which has become virtually universally adopted by the industry is to incline the travel path of the substrates through the solder wave, i.e. from the horizontal, to increase the exit angle between a board being soldered and the solder wave. The art has also devised various wave geometries for further increasing the exit angle and/or changing the point where a substrate exits the wave. Another system for reducing the incidence of solder shorts, icicling and bridging which has achieved substantial commercial acceptance, is to intimately mix soldering oil in the solder wave in accordance with the teachings of Walker et al, U.S. Pat. No. 3,058,441. While such systems have been found to reduce substantially the incidence of solder shorts, bridging and/or icicling, such systems have not entirely eliminated the problem, particularly in cases where relatively high density electronic assemblies and/or relatively long lead components are being soldered to substrates.

Another difficulty commonly encountered has been the inability to control the solder level over a recessed pin in the substrate. The requirement to use the space on small modules of memory chip circuitry in the most efficient manner has led to the flush pin substrate. In this arrangement, the silicon chip and the through pinned ceramic are layered in such a way that the chip lies above as well as beside the pin heads. The clearance between the bottom surface of the chip and the highest part of the metallized and soldered substrate is most important to ensure proper chip-to-substrate joining and joint reliability. To accommodate this, maximum heights of solder, pins and circuitry are specified. These specifications call for a maximum height of 0.003 inches for so-called "C4 fingers" and 0.001 inches elsewhere above the plane of the ceramic surface. Immersion tinning leaves so much solder on the surface especially, at the pin head to circuit connection, that the height specification is exceeded unless special treatment is performed. Previous expedients for counteracting or leveling the solder balls which resulted from the soldering operation have included brushing the solder while still molten and milling the solder after it cools and hardens. Both of these expedients are relatively difficult to achieve in the confined space existing on the surface of a substrate and relatively expensive because of the individualized nature of each operation.

A number of patents typify the prior art relating to leveling of solder on a substrate and removal of excess solder. U.S. Pat. No. 4,083,323 discloses the use of opposed gas knives to remove excess molten solder from a printed circuit board as the board is being withdrawn from a bath of molten solder.

According to U.S. Pat. No. 4,101,066, a circuit board is advanced along a predetermined path so that it engages, in rapid succession, a pair of solder waves flowing in opposite directions, an expedient which is said to reduce crossovers or bridges between the terminals and the conductor paths. A mechanical expedient in the form of cleaning bands provided with bristles to clean the circuit board of soldering and resin remnants arising when soldering components on the board is disclosed in U.S. Pat. No. 4,354,292. According to U.S. Pat. Nos. 4,401,253, 4,402,448, 4,410,126, and 4,469,716, a fluid stream is directed onto a circuit board immediately following deposition of molten solder onto the bard, for eliminating excess solder before it solidifies as shorts, icicles, or bridges. Hot oil is applied to the circuit board surface while solder previously applied is still molten to help alleviate the problem of solder icicles, bridging, etc. according to U.S. Pat. No. 4,463,891.

Yet other expedients, such as rapid deceleration and impact of the frame holding a circuit board to thereby dislodge excess solder, or vibrating circuit boards or other coated articles for the same purpose, are presented in U.S. Pat. Nos. 4,129,668 and 4,501,770. It has also been considered to apply a measured amount of solder to each pin head.

However, as noted above, many of these expedients require complex machinery with the high cost associated therewith, or do not readily lend themselves to high volume, mass production operations, or are not completely effective in achieving the solder leveling and remnant removal which is necessary in order to achieve an end product which is of high quality.

A recently devised method which has experienced a degree of success is disclosed in commonly assigned U.S. patent application Ser. No. 837,817 filed Mar. 10, 1987, now U.S. Pat. No. 4,676,426 issued June 30, 1987 and entitled "Solder Leveling Technique." According to that invention, a pre-fluxed substrate is dipped into a molten solder bath, withdrawn to cool to a temperature below 300° F. then re-dipped into the solder bath, and again withdrawn to cool to room temperature. This procedure results in a leveling of solder balls which had formed over recessed pins and flush filling of passage holes present in the substrate. However, unlike the foregoing recent development, the instant invention utilizes existing machinery and equipment. Furthermore, while the invention results in significant improvements in the quality of the end product and efficiency and economy of its fabrication, this effect as been achieved with minimal change to existing machinery and equipment.

SUMMARY OF THE INVENTION

It was knowledge of the prior art and the problems existing which gave rise to the present invention. In brief, the present invention is directed towards an improved method of and apparatus for solder leveling in printed circuit boards or other circuitized materials.

The method and apparatus of the invention simplifies known procedures, utilizes existing equipment, can be relatively inexpensively performed, and results in a significantly improved end product.

It has been shown that upon removing a substrate from a molten solder bath excess solder can be removed by tapping the substrate against a solid object. The invention is a computer controlled mechanism which allows this technique to be performed very rapidly on a large number of substrates. Since the dipping of substrates into molten solder is one of the many sub-processes conducted by a multiple function machine known as the Austin tinner, the invention represents a significant enhancement to the Austin tinner at the point of substrate dipping.

The manufacturing of substrates using the modified Austin tinner machine progresses generally as follows: Sixty-six substrates are hand loaded into a rack which is then clamped in place on one of the machine's thirty-nine arms. As an arm indexes through the machine, it will eventually arrive at a molten solder dip station, or pot. At this point, the arm is lowered, causing the rack to descend into the solder in the pot. The substrates are then agitated in a unique manner relative to the solder to thereby enhance the adherence of the solder to the substrate surface. After a predetermined length of time, the arm is raised up to thereby lift the rack out of the pot. Under normal Austin tinner operation, the arm would proceed to a further station on the basis that the condition of the soldered surface on the substrate was acceptable, or at least, was the best obtainable. However, when the modified machine is operated, the rack is caused to strike an anvil one or more times to dislodge any excess molten solder.

A first feature of the invention relates to the construction which enables rotation of the rack relative to the arm. On all other tinners, this relative rotation is achieved through movement of the arm along an associated cam track. As the arm traverses the cam track, a second cam track acts upon the rack, causing the rack to rotate. The relative displacement of the two tracks is transmitted into rotation of the rack relative to the arm. This arrangement is acceptable; however, the arm must be in transition to achieve this rack rotation. In contrast, the invention provides an activation mechanism incorporated into the track itself which allows for independent rack rotation without arm movement. Thus, the arm can remain motionless while the rack is free to flutter up and down like a bird's wing. This feature is unique to the invention as it is the only tinner known to the inventors which permits rack rotation independent of arm movement.

A second feature relates to providing an anvil for the fluttering rack to impact against. A permanently mounted anvil could not be possible since it would interfere with the subsequent arm movement. This problem was solved by placing the anvil on a computer controlled rotating device which rotates the anvil between a home position which is safely out of the way and an impact position at precisely the right instant. Nor is this feature to be found on any other tinner known the inventors.

A third feature relates to the arm itself onto which the rack loaded with substrates is attached. The conventional arm has been modified to provide two additional, very important, movements. The first additional movement concerns rack rotation. To enhance the rotating effect, a spring collar has been added to the shaft on which the rack rotates. By allowing a tension spring, one end of which is attached to the collar to generate a rotating force, to act around the circumference of this collar, a more dependable rotating force is developed. This is considered an important feature for assuring the proper control of the impact parameters, such as angular acceleration and angular velocity of the rack at the instant of impact. The second additional movement concerns the operation of the arm when it is submerged in the molten solder. The original Austin tinner machine provided for vibrating the rack through a distance of 0.060 inches while in the solder. The invention, however, requires a violent agitation of the rack while in the solder, through a substantially longer distance—upwards of 1.00 inch.

The uniqueness of these features is demonstrated in the fact that no other tinner has a smooth, constant rack rotating force capable of generating sufficient angular accelerations for obtaining the required impact force, nor does any tinner have the capability of a full 1.00 inch agitation of the rack while in the solder bath.

A fourth feature of the invention is a computer controlled clamping device which is used to hold the arm steady during the impact operation. Without this clamp, the arm sways uncontrollably. When the clamp is activated, it physically engages the arm or structure associated with the arm and when the clamp is de-activated, it physically moves out of the way of the arm so the arm is free to travel. The uniqueness of this clamping device is found in the realization that no other tinner known to the inventors employs such a device to stabilize the arm.

A fifth feature of the invention relates to the unique design and operation of the solder pot which provides a wave or fountain important for proper soldering of parts while carrying away all undesired contamination from the parts during the normal course of the process. This result is achieved by causing the solder to rise in a pump-fed chimney which draws molten solder from the bottom of the melting pot and forces it to rise in the form of a low fountain or wave. The parts to be tinned are actually forced down into the chimney, that is, submerged, rather than merely floated on the surface. By so doing, superior results are more rapidly achieved, by causing clean hot solder to impinge on the submerged parts. Furthermore, the operation and design assure that spent flux and other contamination known as dross and oxides are constantly being removed from the area through which the parts pass as they are withdrawn from the pot. Thus, the design enables rapid heating of parts and elimination of unwanted inclusions thereby assuring a high quality consistent finish on the parts.

Other and further features, objects, advantages, and benefits of the invention will become apparent from the following description taken in conjunction with the following drawings. It is to be understood that both the foregoing general description and the following detailed description are exemplary and explanatory but not restrictive of the invention. The accompanying drawings, which are incorporated in and constitute a part of this invention, illustrate some of the embodiments of the invention and, together with the description, serve to explain the principles of the invention in general terms. Throughout the disclosure, like numerals refer to like parts.

DETAILED DESCRIPTION OF THE DRAWINGS

FIG. 16 is a front elevation view of actuating mechanisms employed in the operation of the machine;

FIG. 17 is a detail elevation view, certain parts being cut away and shown in section for clarity, illustrating a rack supporting arm of the machine illustrated in FIG. 3;

FIG. 20 is a detail perspective view, in two parts, illustrating the rack holding spindle of the invention;

FIG. 20A is a detail elevation view of a part illustrated in FIG. 20 and illustrating the part in its locking position;

Figure 23:
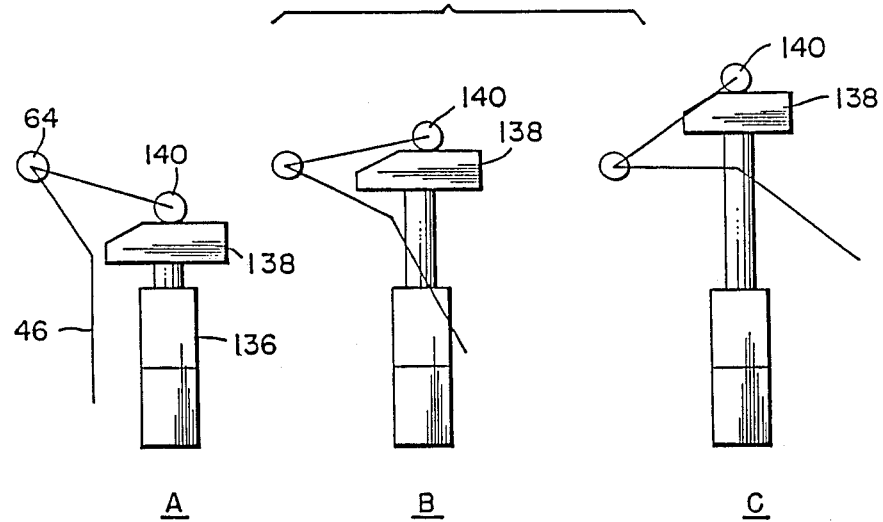
Figure 15B:
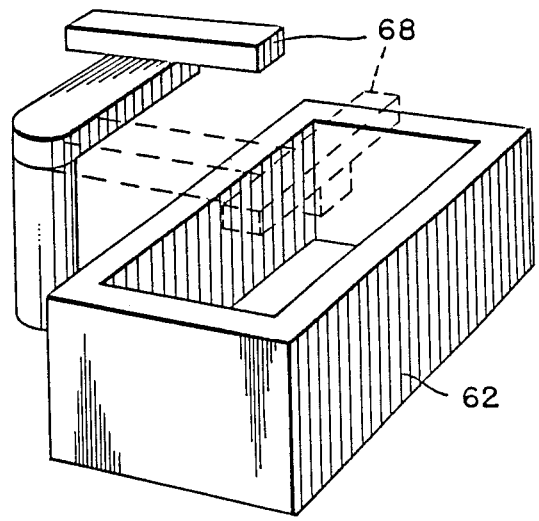

FIGS. 23A, 23B, and 23C are diagrammatic elevational views which illustrate successive positions of an actuating mechanism employed by the invention.

DESCRIPTION OF THE PREFERRED EMBODIMENT

Figure 1A:
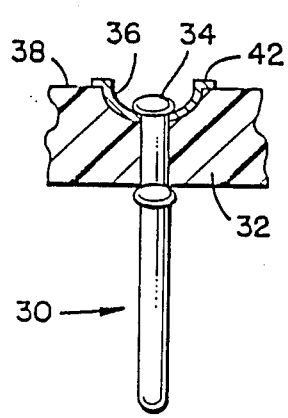
FIG. 1A is a detail cross-section view, in elevation, of a portion of a circuitized substrate with a recessed mounting pin thereon.
Figure 1B:
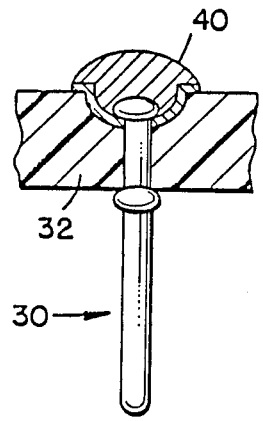
FIG. 1B is a detail cross-section view, in elevation, illustrating the circuitized substrate of FIG. 1A after it has been immersed in, then withdrawn from, a molten solder bath.

The present invention is concerned with apparatus and methods of controlling the solder level over a recessed pin in a substrate With attention directed to FIG. 1B, a mounting pin 30, typically composed of copper, or at least copper coated, is mounted on a substrate 32 which is of a dielectric material such as ceramics or of a glass/polymer base composition. In typical fashion, the mounting pin 30 has a head 34 which is received in a recess 36 formed in an upper surface 38 of the substrate. In order to meet the requirements of one specification customarily used in the industry, the height of the head 34 can vary between being flush with or below the upper surface 38. By this same specification, after solder 40 (FIG. 1B) has been applied to the substrate 32 so as to overlie and conceal the head 34, the solder level should not be higher than 0.001 inches above the surface 38.

In the past, these tolerances were maintained by brushing the solder while it was still in the molten state, or by milling. However both of these techniques had drawbacks which are eliminated by the present invention. It should be understood that for ease of illustration, the substrate 32 is illustrated without any coating on its upper surface 38, although metallization 42 is generally indicated in the immediate region of the recess 36. In actual practice, the upper surface 38 is usually coated as will be described below.

According to the invention, a flux agent is first applied to those surfaces of the substrate 32 on which solder is to be coated. Basically, fluxes are materials that remove contamination from the surface of a material to be soldered so that wetting can occur. The flux agent breaks up and removes tarnish layers on the copper surfaces either by chemical combination or by chemical reduction. The flux agent also has to protect the surface of the metal during the soldering action. An example of a suitable flux is that manufactured by Alpha Metals as Flux Type Alpha 100, although numerous other types and sources could be utilized. The flux agent is applied by total immersion of the substrate 32 in the flux bath to assure wetting of the entire surface 38 of the substrate. Thereupon, molten solder is applied to the fluxed outer surface of the substrate 32.

FIG. 1B represents the customary condition of the solder 40 upon withdrawal of the substrate 32 from a molten solder bath, specifically resulting in the formation of a solder ball over the head 34. Thereupon, a support on which the substrate 32 is temporarily mounted, is caused to impact against an anvil while the solder 40 is still molten, causing excess solder to become dislodged from the substrate and forming a neat, concave solder coating 44 over the head 34 as illustrated in FIG. 1C.

The apparatus for achieving the end result just described will now be disclosed.

Figure 1C:
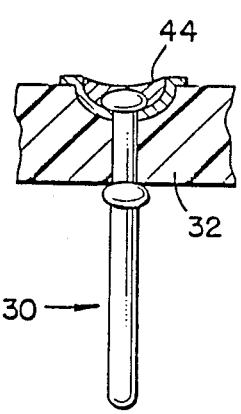
FIG. 1C is a detail cross-section view, in elevation, similar to FIG. 1B, illustrating the condition of the circuitized substrate after it has been operated upon in accordance with the invention.
Figure 2:
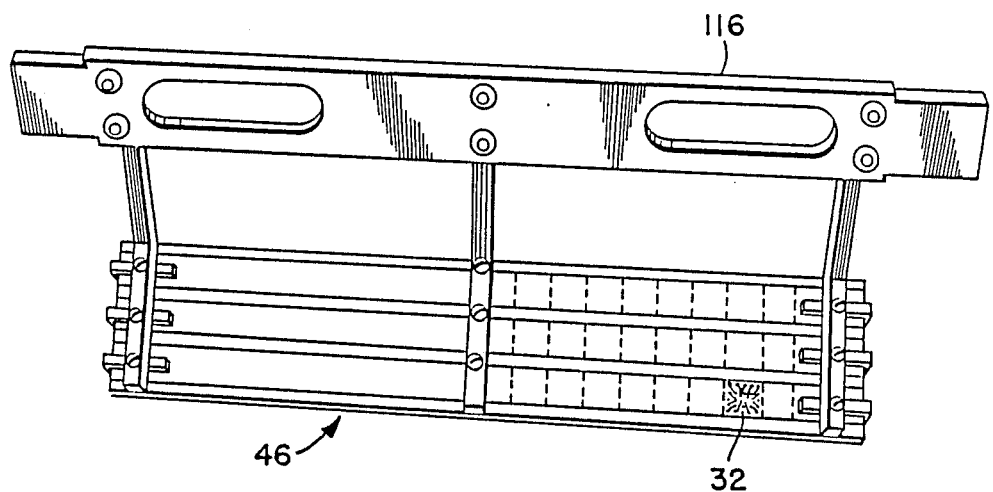
FIG. 2 is a perspective view of a rack utilized by the invention for holding a plurality of substrates to be tinned.
Figure 3:
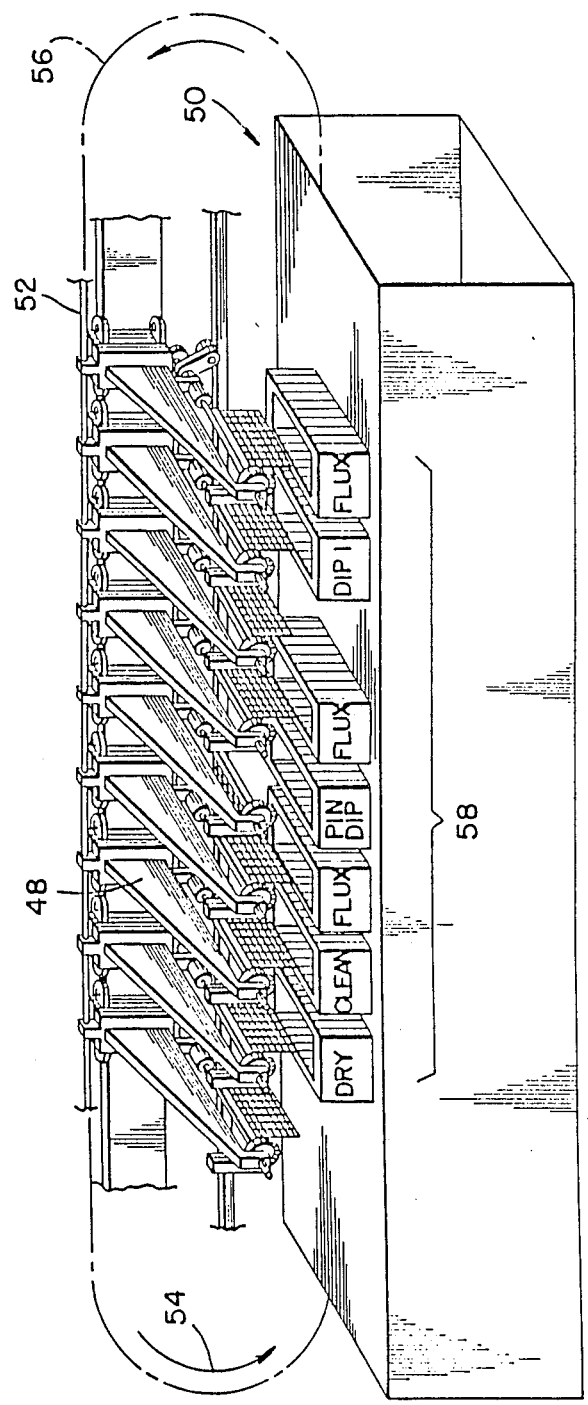
FIG. 3 is a diagrammatic perspective view of a portion of an Austin tinner machine which embodies the invention.

The apparatus which embodies the invention and which results in the improved article of manufacture as illustrated in FIG. 1C will now be described with specific reference, initially, to FIGS. 2 and 3. Parts having the nature of substrates 32 with pins 30 pre-mounted therein are hand loaded into standard Austin tinner racks 46 using standard loading fixtures. Typically, the racks 46 hold 66 substrates. The racks 46 are then mounted onto arms 48 of an Austin tinner machine 50 modified in accordance with the invention. The modified Austin tinner machine 50 which is incompletely shown in FIG. 3, actually includes a total of thirty-nine arms 48 which are suitably mounted on a continuous conveyor 52 which advances in the direction of arrows 54 along a path 56 lying in a generally vertical plane. The arms 48 have been modified in a manner to be described so as to accommodate the racks in a particular way and to perform particular movements as will be described subsequently. As the arms 48 are advanced along the path 56 by the conveyor 52, the racks 46 move past a series of individual work stations 58 at each of which is performed at least one discrete operation on a substrate 32.

Figure 4:
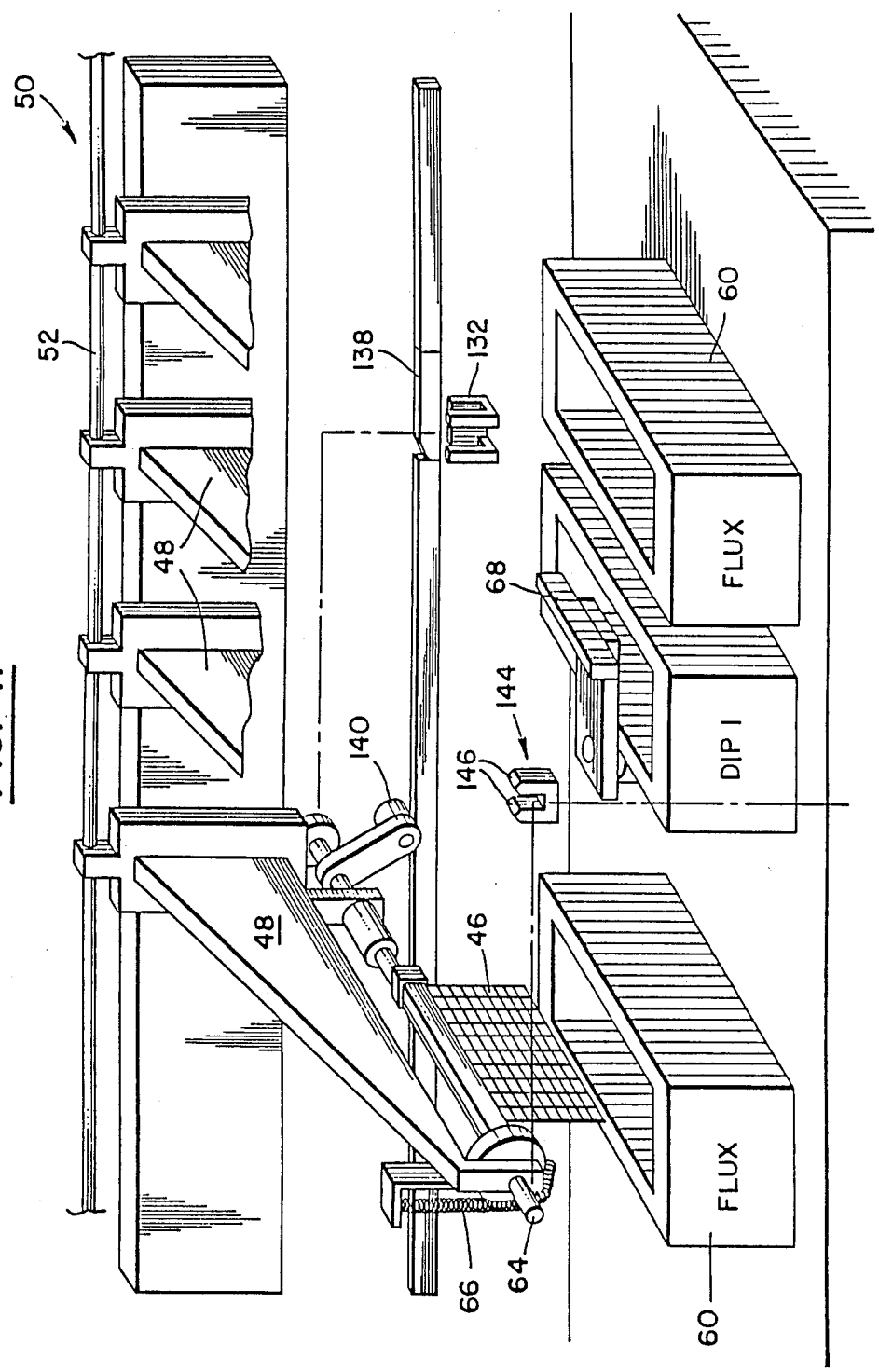
FIG. 4 is a detail perspective view illustrating a particular group of stations of the machine illustrated in FIG. 3 at which operations with which the invention is concerned are performed.
Figure 5:
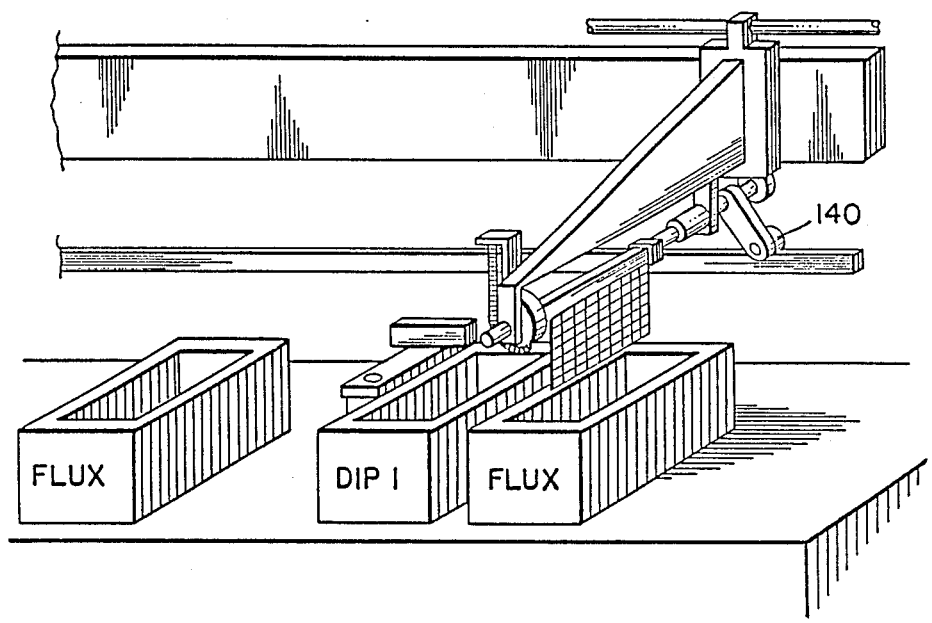
FIGS. 5-15 are detail perspective views, similar to FIG. 4, illustrating successive steps in the operation of the machine illustrated in FIG. 3 and which reflect the invention.
Figure 6:
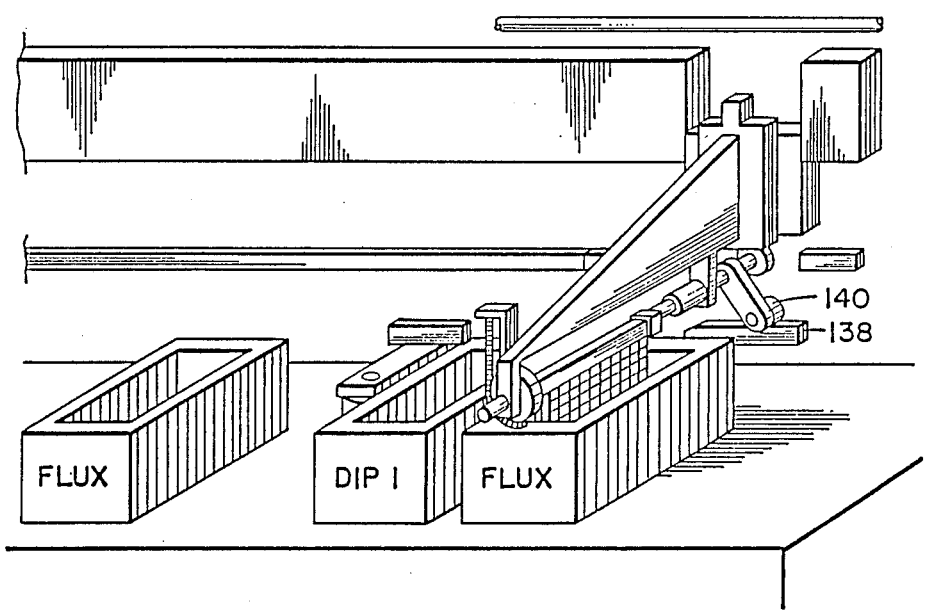
Figure 7:
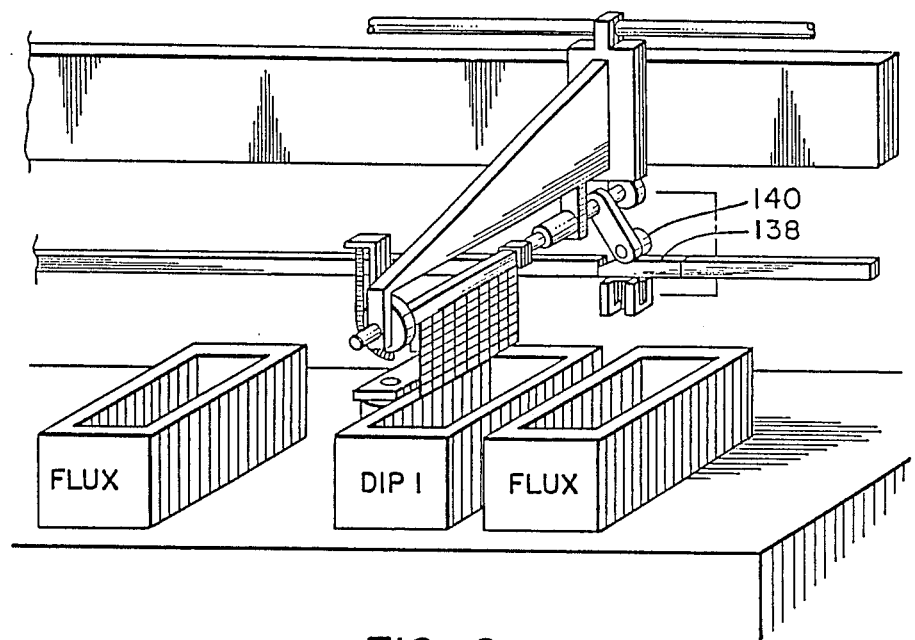
Figure 8:
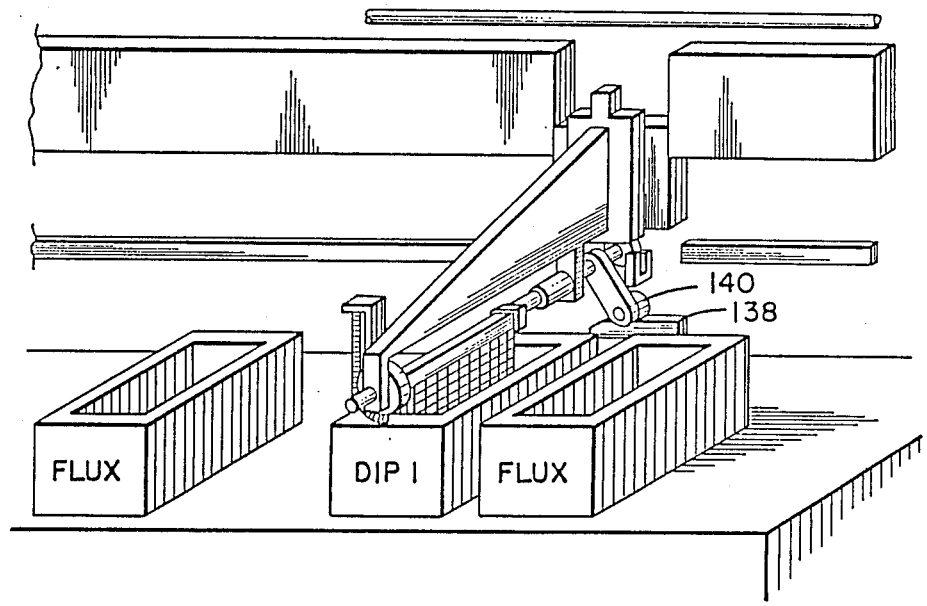

Turn now to FIG. 4 which generally illustrates the locations of those operations performed by the machine 50 which primarily comprise the invention, as well as to FIGS. 5-15 which depict successive operations performed by the machine 50 in the region illustrated by FIG. 4. Thus, as an arm 48 is advanced by the conveyor 52 to a position overlying an open top flux receptacle 60 (FIG. 5), the conveyor 52 is temporarily stopped and an appropriate mechanism is operated to allow the rack 46 and its cargo of substrates 32 to be submerged in the liquid flux for a brief time (FIG. 6) and then withdrawn. The arm 48 is then advanced to the next station (FIG. 7) so as to overlie a vessel 62 containing molten solder. Once again, a suitable mechanism is operated which allows the rack 46 and its cargo of substrates 32 to descend into the molten solder (FIG. 8). With the rack and its substrates fully immersed in the solder, the rack is vigorously agitated in a unique manner and by means of a unique mechanism as will be subsequently described. In this fashion, the solder is forced into intimate contact with all portions of the substrates 32 and the flux applied at the previous station is displaced in such a manner that fast and reliable wetting of the substrate surfaces is obtained.

The solder vessel 62 is likewise of a unique design and operation and will be described in detail. For reasons which will be made clear subsequently, the combination of the unique operation and construction of the vessel 62 together with the vigorous agitation of the substrates 32 on the racks 46 cause very rapid heating of the substrates by exposing them to continuously refreshed hot solder and enables normal immersion times to be greatly reduced. After the rack 46 and its cargo of substrates 32 have been immersed in the molten solder for a predetermined period of time, for example eight seconds, the rack is quickly withdrawn from the vessel 62.

Figure 9:
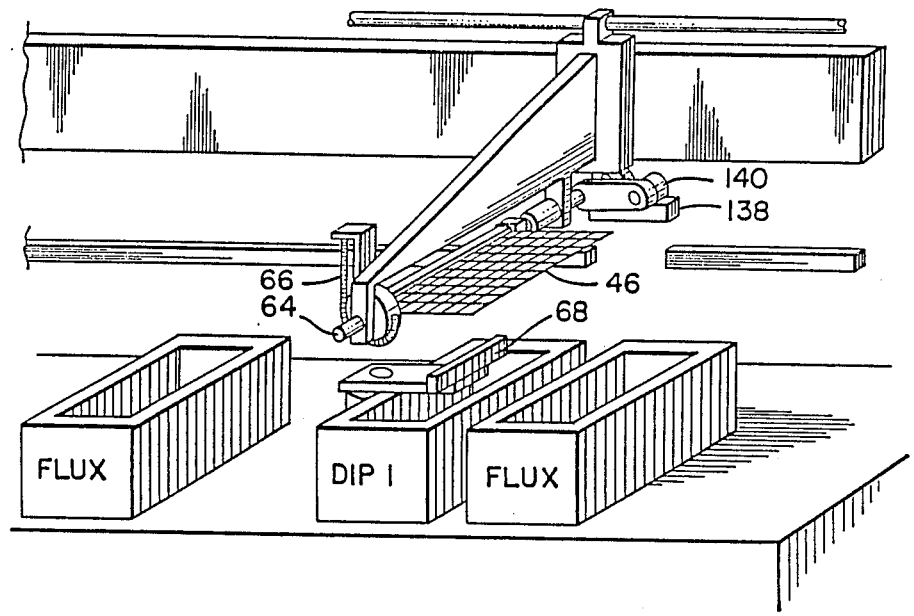
Figure 10:
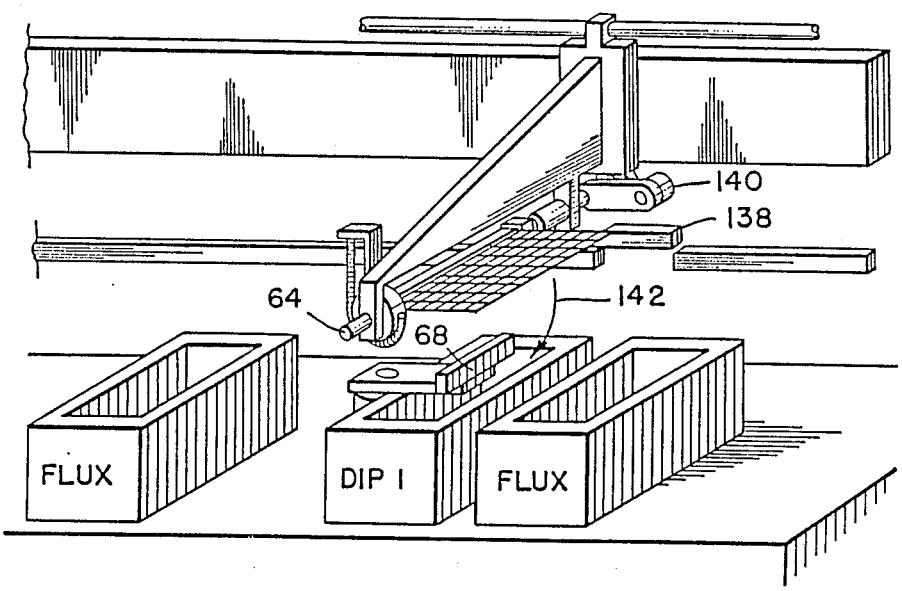
Figure 11:
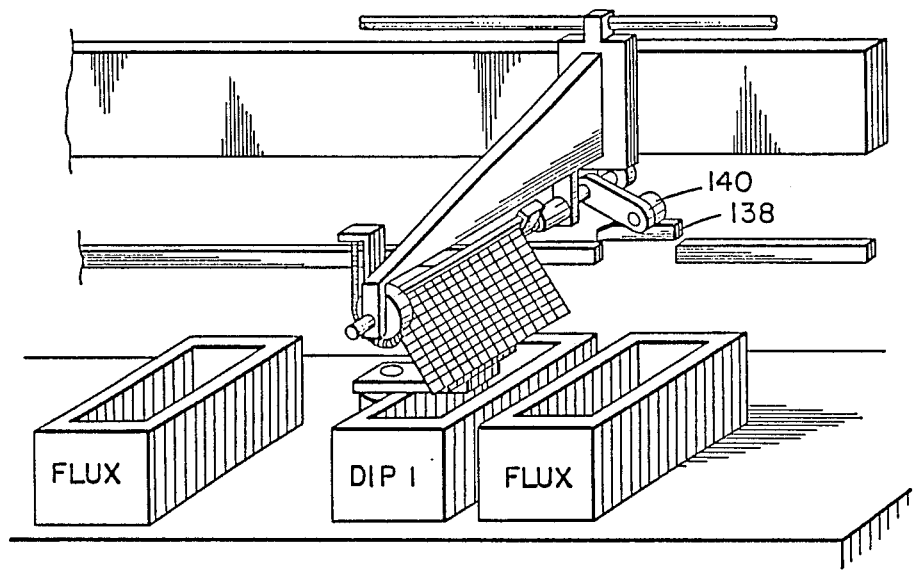
Figure 12:
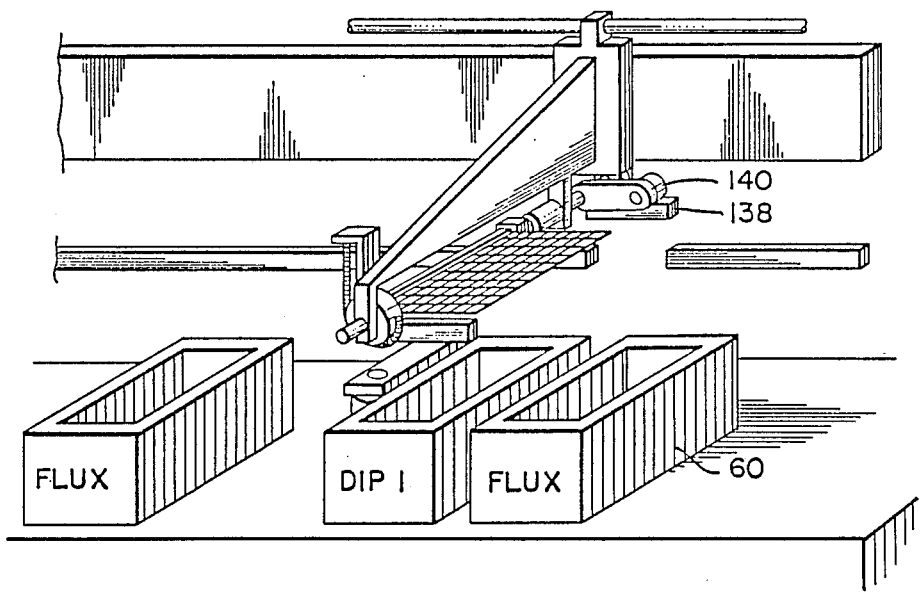
Figure 13:
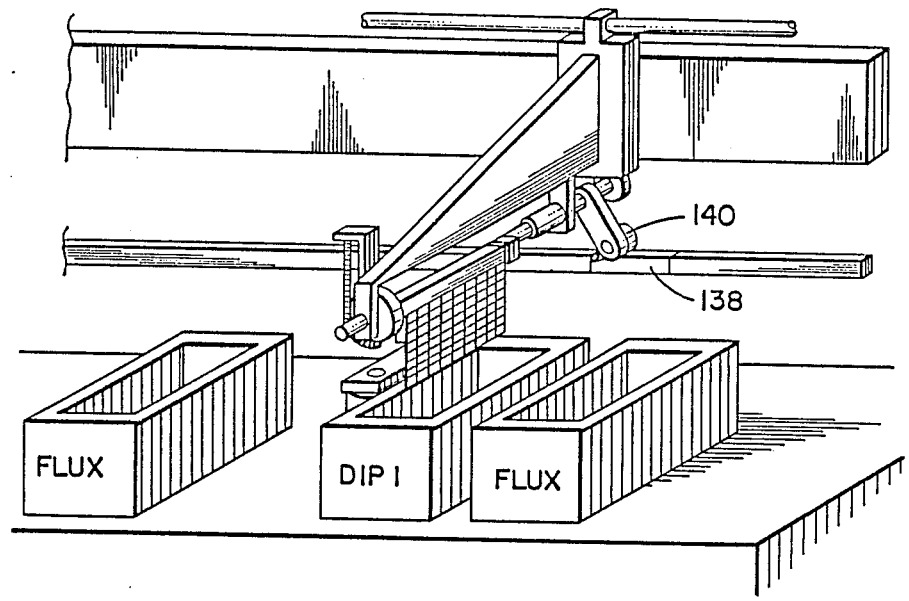
Figure 14:
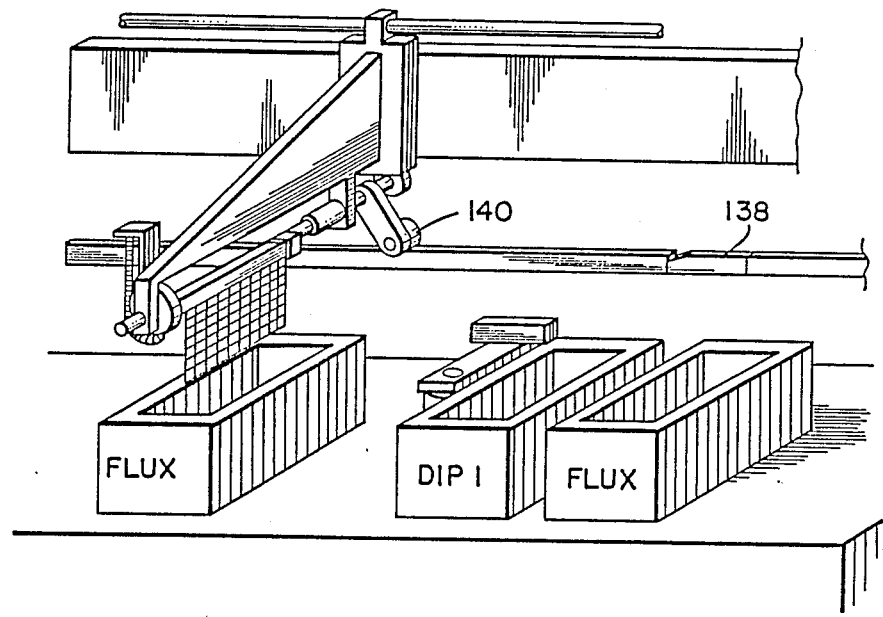
Figure 15A:
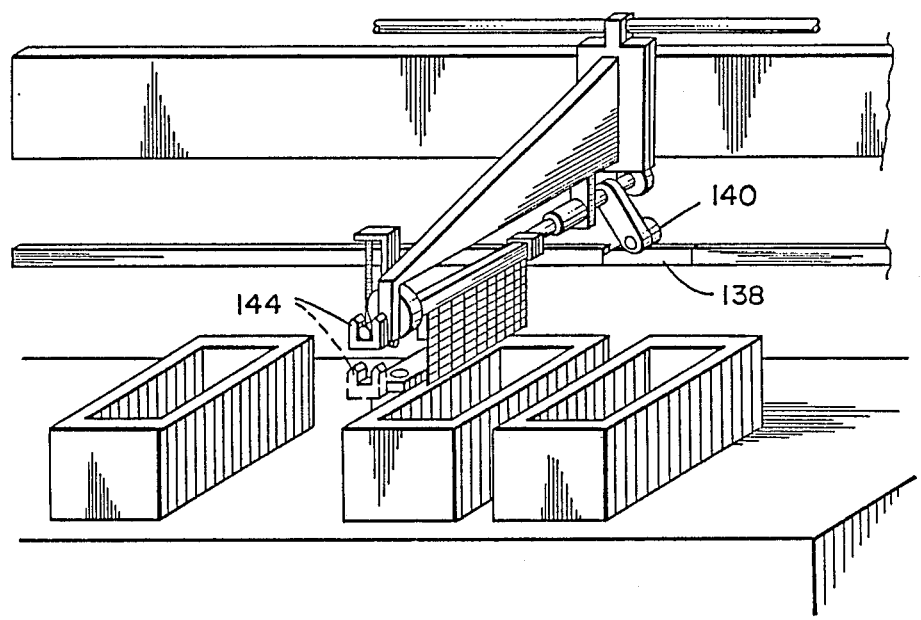
FIG. 15B is a diagrammatic perspective view illustrating the anvil in its retracted and advanced positions.

While still overlying the vessel 62, by means of a mechanism which will be described, rack 46 is pivoted upwardly about a supporting spindle 64 to a cocked position (FIG. 9). The rack is then released from its cocked position (FIG. 10) and under the force of gravity together with the aid of a tension spring 66 whose construction and operation will be more specifically described, cause the rack to pivot downwardly and toward an anvil 68 which has contemporaneously moved from a retracted position into the impact position. However, before the rack reaches the anvil, the lifter 138 is arrested in an intermediate position (FIG. 11) by means of the actuator 136, intercepting the descending roller follower 140 and stopping further rotation of the spindle 64. However, by reason of a unique loose coupling, to be described, between the rack 46 and the supporting spindle 64, the rack continues its downward movement and strikes the anvil under its own momentum (FIG. 11). This decoupling serves to reduce damage to the rack which would otherwise be caused by excessive forces caused by momentum of the other moving parts which include the supporting spindle 64 and the tension spring 66. When the rack 46 and its cargo of substrate 32 impact the anvil 68, the excess solder is freed from the substrate surfaces as well as from the rack surfaces and discharged back into the vessel 62 since the operation takes place immediately above that vessel.

However, not all of the solder is freed from the substrate and rack surfaces in one operation because of the tendency of solder which has been freed to be recaptured in another place. The operation of the machine 50, then, is such that the rack is subsequently recocked, then released several times in rapid succession such that, typically, four to eight impacts are accomplished in approximately one and one-half seconds Since the excess solder is propelled in the direction of the vessel 62, no special catching mechanism is required and the solder thus ejected is immediately reusable.

After the last impact of the rack 46 against the anvil 68, the anvil is retracted (FIG. 12), the rack pivoted to its traveling attitude, and the arm 48 is advanced by the conveyor 52 to a quench station occupied by another flux receptacle 60. The rack 46 is caused to descend into a flux and solvent mixture within the receptacle 60 for cooling and cleaning the residual flux from the substrates 32. This particular operation and subsequent cleaning and pin tinning operations performed by the machine 50 are substantially the same as performed by the unmodified Austin tinner machine.

The specific structure of the modified mechanisms of the machine 50 which comprise the invention will now be described.

With the arm 48 positioned so as to overlie the solder vessel 62 as illustrated in FIG. 7 a suitable actuating mechanism which may be in the form of a hydraulic cylinder 72 (FIG. 16) is operated to move a lifter 74 to allow the arm 48 to descend and thereby submerge the rack 46 in the molten solder within the vessel 62. To achieve this movement, the arm 48 is provided with a roller follower 76 (FIG. 17) rotatably mounted on an extension ear 78 integral with the arm. The roller follower 76 is positioned to be in rolling engagement with the lifter 74. Thus, when the lifter 74 is caused to descend upon retraction of the hydraulic cylinder 72, the cam roller follows along, and with it the rack 46 with its cargo of substrates 32.

Figure 18:
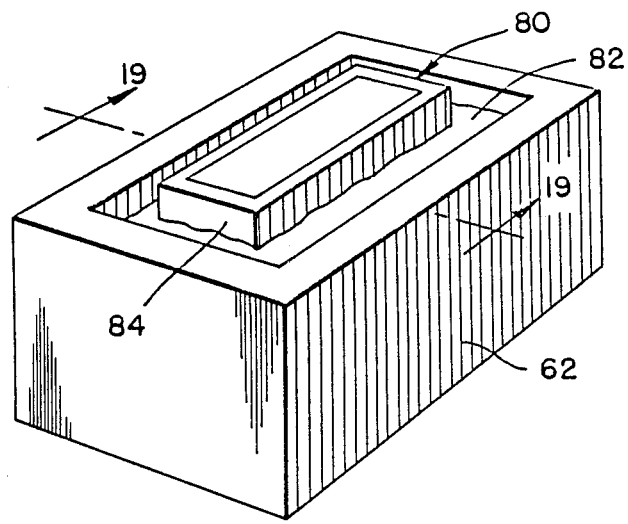
FIG. 18 is a detail perspective view of a unique vessel for holding solder, which is a part of the machine illustrated in FIG. 3.
Figure 19:
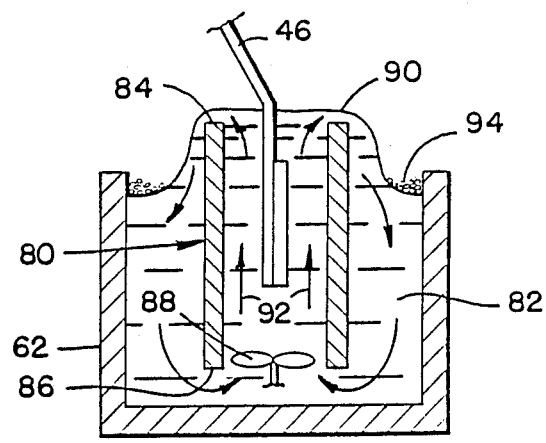
FIG. 19 is a cross section view taken generally along line 19—19 in FIG. 18.

As illustrated in FIGS. 18 and 19, the solder vessel or pot 62 is provided with a somewhat centrally positioned upright chimney 80 which is adapted to be filled with molten solder 82. The chimney has an open upper end 84 and a lower end 86 immersed in the solder when the vessel 62 is filled. As seen especially clearly in FIG. 18, the upper end 84 is positioned to extend above the level of the molten solder 82. A suitable circulating pump 88 causes flow of the solder from the vessel 62 through the lower end 86, then through the upper end 84 and back into the vessel 62.

In effect, the arrangement depicted in FIGS. 18 and 19 results in the formation of a wave or fountain 90 of molten solder in the vicinity of the upper end 84 of the chimney 80. The specific novelty of this arrangement resides in the fact that the rack 46, and particularly the substrates 32, are forced down into the chimney 80 rather than floated on the surface. In this way, superior results are obtained more rapidly by impinging, continuously, clean hot solder upon the submerged substrates. By reason of the solder flow in the direction of arrows 92 (FIG. 19) surplus spent flux is constantly being carried away and keeps the solder surface in a wave or fountain 90 clear of dross and oxides, that is, in the critical area through which the substrates pass when they are removed from within the chimney. As can be seen in FIG. 19, the dross and oxides 94 collect on the surface of the molten solder 82 outside of the chimney 80 and are periodically removed in any suitable manner. In this way, rapid heating of the substrates and their freedom from unwanted inclusions during the tinning process is obtained resulting in a high quality consistent finish.

Before the operation of agitating the rack and substrates while they are immersed in the molten solder within the vessel 62, it is necessary, first, to describe the modifications which have been made to the arm 48. These modifications are particularly well shown in FIGS. 17 and 20. It was previously mentioned that each arm 48 is mounted at one end to the conveyor 52 and is generally cantilevered outwardly therefrom so as to overlie the work stations 58 as the conveyor is advanced upon operation of the machine 50. The extension ear 78 depends from the main structure of the arm 48 adjacent to the conveyor 52 and another extension ear 96 depends from the arm 48 at its extreme outer end distant from the extension ear 78. The supporting spindle 64 extends between, and beyond, the extension ears 78 and 96 and is mounted thereon by suitable bearings 98 for both rotation and longitudinal movement thereon. A collar or spring seat 100 is fixed to the spindle 64 against longitudinal movement in any suitable fashion. A compression spring 102 is received on the spindle 64 and interposed between the extension ear 78 and the collar 100 and serves to bias the spindle 64 to an extreme right, or home, position as indicated in FIG. 17.

As seen especially well in FIGS. 17 and 20, the spindle 64 has a central crank region 104 which is generally rearwardly offset from the axis of rotation of the spindle 64 as defined by the bearings 98. In addition, the crank region 104 has a flatted surface 106 which generally faces the imaginary axis of rotation of the spindle 64.

Figure 21:
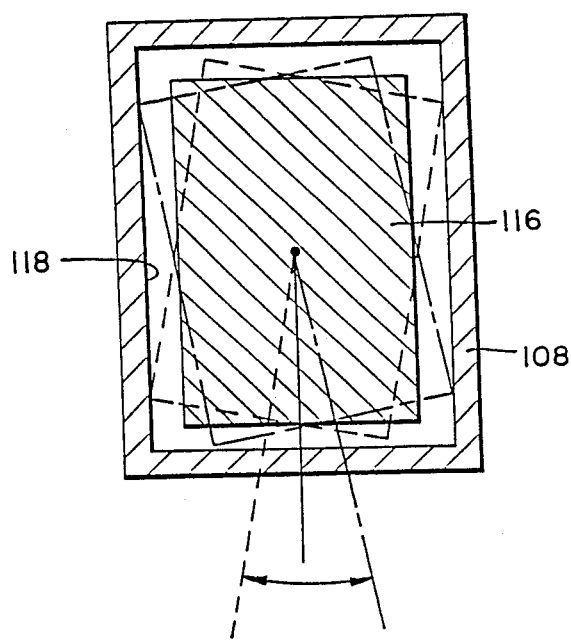
FIG. 21 is a cross section view taken generally along line 21—21 in FIG. 20 and illustrating the relative positions of the rack relative to the spindle which occur during operation of the machine.

As seen in FIGS. 20 and 21, an enclosed socket member 108 is suitably fixed, as by fasteners (not shown) to the flatted surface 106 at the end of the crank region 104 nearest the extension ear 78. An open socket member 112 is similarly mounted to the flatted surface 106 as by suitable fasteners (not shown) at the end of the crank region 104 nearest the extension ear 96. Each rack 46 includes a top rail 116. One end of the top rail can be longitudinally inserted into an inner cavity 118 of the socket member 108. As seen in FIG. 21, the inner cavity is substantially larger than a cross section of the top rail 116 such that the top rail can rotate relative to the socket member 108 within the limits indicated by dashed and by dashed-and-dotted lines, respectively. With one end of the top rail 116 received within the socket member 108, its opposite end can then be laterally moved for reception within the socket member 112 since the socket member 112 lacks an outer face, unlike the socket member 108. It will be appreciated that by reason of the offset crank region 104 of the supporting spindle 64, the top rail 116 is substantially aligned with the axis of rotation of the spindle as defined by the bearings 98.

Figure 22:
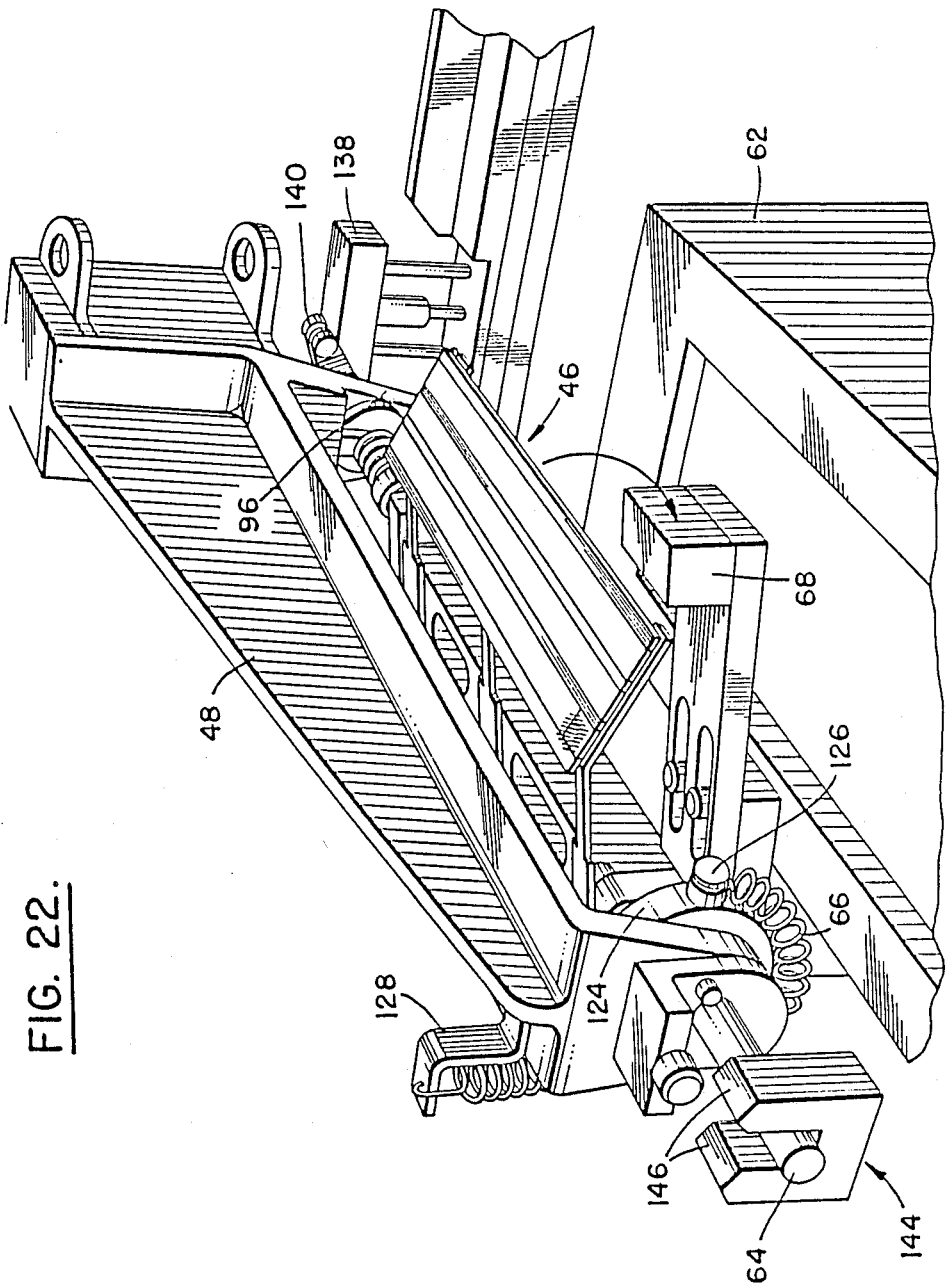
FIG. 22 is a detail perspective view of the rack supporting arm with parts positioned as the impacting operation is about to commence.

Thereupon, viewing FIGS. 20. and 20A, a block 120 pivotally mounted as at 122, is movable from a withdrawn position (FIG. 20) to an extended position (FIG. 20A) for loosely confining the end of the top rail 116 in the socket member 112. The block 120 is pivotably mounted on an impact drive spool 124 which is appropriately fixed on the spindle 64 adjacent to the extension ear 96 (see FIG. 17). It will be appreciated that the end of the top rail 116 confined by socket 112 and block 120 has substantially the same degree of freedom relative to the spindle 64 as does the other end within the socket 108. As most clearly seen in FIG. 22, a knob 126 is fixed to an outer rim of the drive spool 124 and extends radially outwardly therefrom. One end of the tension spring 66 is suitably fastened to the knob 126 and extends to its other end which is suitably fastened to a bracket 128 fixed to the arm 48.

Again as best seen in FIG. 17, a flanged member 130 is fixed to an extreme end of the spindle 64 nearest the conveyor 52. When the hydraulic cylinder 72 is operated so that the rack 46 is submerged in the molten solder within the vessel 62 (FIG. 8), the flanged member 130 is engageably received by a suitable coupling 132 which is operably attached to a suitable reciprocable actuator 134. With the flanged member 130 engaged by the coupling 132, agitation of the rack and its substrates within the molten solder occurs. This agitation is provided by an electronically controlled, hydraulically operated, linear power drive as provided by the actuator 134. Under program control, the actuator alternatively retracts and extends in a predetermined manner. Frequency, amplitude, and wave shape can be selected to suit specific requirements for coating the substrates 32. In the instance of the machine 50, for example, amplitude can be selected in increments up to one inch and at frequencies within the range of 0 to 100 hertz. In actual fact, it is desired that the rack 46 be operated at such an amplitude and frequency as to attain a maximum speed within the range of 10 to 50 inches per second during a sweep in both directions. Such agitation insures excellent wetting and rapid heating of the substrates. Furthermore, this long excursion agitation assures that solder is forced into intimate contact with all parts of the substrate and that flux is displaced thereby achieving rapid and reliable wetting of the substrate surface. After about eight seconds of agitation in the molten solder within the unique vessel 62 and chimney 80, the substrates 32 are completely tinned and ready to be levelled. The hydraulic cylinder 72 is then actuated to raise the cam roller 76 and with it the arm 48 in a high speed operation. When the arm 48 has reached its uppermost position, an actuator 136 which may be an air cylinder, is effective to raise a lifter 138 to the upper dashed line position as illustrated in FIG. 16. A spindle cam roller 140 (FIG. 17) which rides along the upper surface of the lifter 138 is thereby raised, thus rotating the spindle 64 until the rack 46 assumes a substantially horizontal position as illustrated in FIG. 9, and as shown diagrammatically in FIG. 23C (the cocked position). As the spindle rotates to the FIG. 9 position, the spring 66 is caused to lengthen thereby biasing the spindle in counterclockwise direction (FIG. 9). When the rack has thus been raised to its cocked position, the anvil 68 swings from its retracted position to its advanced position overlying the vessel 62. (See FIGS. 9, 10 and 15A).

The actuator 136 descends (FIGS. 10, 16, and 23B) and stops under pneumatic control at the intermediate dashed line position (FIG. 16). This operation is performed in such a manner that the acceleration of the actuator 136 is greater than that of the cam roller 140 (FIG. 10) which is rotated by gravity as well as by tension of the spring 66. As seen in FIG. 10, the spindle 64 begins to rotate in the direction of an arrow 142, bringing the rack 46 with it in the direction of the anvil 68 from the FIG. 23C position to the FIG. 23B position. When the lifter 138 stops (FIGS. 12 and 23B), the rack 46 has not yet reached the anvil 68. However, by reason of the construction provided by socket members 108, 112, block 120, and the associated ends of the top rail 116, the rack 46 continues to swing under its own momentum, striking the anvil in such a position that the socket members 108 and 112 and the top rail 116 are not driving each other. While the spindle 64 is rotating and carrying the rack 64 towards the anvil 68, the top rail 116 assumes. the leftwardly tipped position illustrated by dash-dot lines in FIG. 21. The socket 108 will then stop under control of the cam roller follower 140 acting against the lifter 138 as depicted in FIG. 23B, that is, the intermediate position. The rack will continue to swing under its own momentum, striking the anvil (FIGS. 11 and 23B) before the socket 108 and top rail 116 reach the position illustrated in FIG. 21 in which the top rail leans to the right as indicated by dashed lines.

Thereupon, the actuator 136 again drives upwardly to the position illustrated in FIG. 23C. The rack 46 is also lifted away from the anvil 68 when the relationship between the socket member 108 and the top rail 116 reach the position as indicated in FIG. 21 as indicated by dashed lines. This whole sequence of raising or cocking and subsequent release is repeated as many times as necessary. The impact described is between the rack 46 and the retractable anvil 68. The deceleration experienced by each of the substrates 32 effectively throws off any excess solder from the substrate surface. The impact can be modified and brought under fine control by use of a suitable resilient insert (not shown) at the point or points of impact. The technique just described reduces the jarring and unwanted vibrations which otherwise would cause damage to the rack 46 and inconsistent results.

A further expedient which has also been found to be helpful in reducing vibration and in improving the ability of the machine to obtain consistent results is a stabilizer member 144 (see FIGS. 4, 15, and 17) which is computer controlled and used to hold the arm 48 steady during the agitation and impact operations. The stabilizer member 144 has an upper bifurcated end 146 which is raised to receivably engage therein the extreme end of the spindle 64 distant from the location at which the arm 48 is attached to the machine 50. When the impact operation has been completed, the stabilizer member is withdrawn to a position at which it does not interfere with the continued operation of the machine. It will be appreciated that it would be within the scope of the invention for the stabilizer member to engage in some way and hold the end of the arm 48 at generally the same location.

In the foregoing description, there has been presented a major modification in the form of electro-mechanical computer controlled mechanisms to the existing Austin tinner machine. However, it will be understood that the various aspects of the disclosure could properly be applied to other machines or be used independently in a variety of other applications. In short, while a preferred embodiment of the invention has been disclosed in detail, it should be understood by those skilled in the art that various other modifications may be made to the illustrated embodiment without departing from the scope as described in the specification and defined in the appended claims.

What is claimed is:

1. Apparatus for solder leveling a circuitized substrate to produce substantially flush solder fill over pins recessed in the substrate comprising:

support means including a rack mounted thereon for carrying at least one pin containing substrate; an arm mounted at one end to said conveyor means and generally cantilevered outwardly therefrom so as to overlie a series of individual work stations at each of which can be performed at least one discrete operation on the substrate as it is advanced by said conveyor means; a spindle generally coextensive with said arm; and bearing means pivotally mounting said spindle on said arm;

conveyor means operable for advancing said support means along the series of individual work stations, said conveyor means operable for interrupting movement of said rack means at each of the work stations to enable the discrete operation to be performed on the substrate, one of the work stations having a vessel filled with molten solder; and elevator means adjacent the vessel for selectively moving said support means, when operation of said conveyor means is interrupted adjacent the vessel, between a raised position at which said rack is withdrawn from the vessel and a lowered position at which said rack is immersed in the molten solder.

2. Apparatus as set forth in claim 1 wherein:

said bearing means also allows reciprocating movement of said spindle relative to said arm; and including:

agitation drive means selectively engageable with said spindle when said arm is in the lowered position for reciprocating said spindle and said rack thereon.

3. Apparatus as set forth in claim 2 wherein:

said agitation drive means is effective to move said spindle longitudinally at such an amplitude and frequency as to attain a maximum speed in the range of 10 to 50 inches per second.

4. Apparatus as set forth in claim 2 wherein:

said arm includes:

a pair of transversely extending ear members at spaced apart locations; and wherein:
    said spindle includes:
        a flange integral with one end thereof lying generally in a plane perpendicular to a longitudinal axis of said spindle; and
        a collar fixed on said spindle;
wherein:
    said agitation drive means includes:
        a coupling engageable with said flange when said arm in the lowered position; and
wherein:
    said bearing means includes:
        journals within each of said ear members;
    said apparatus including resilient means interposed between said collar and one of said ear members for biasing said spindle to a home position whereat said flange is aligned with said coupling for engagement therewith when said arm is in the lowered position.

5. Apparatus as set forth in claim 4 wherein:
    said drive means is effective to move said spindle longitudinally at such an amplitude and frequency as to attain a maximum speed in the range of 10 to 50 inches per second.

6. Apparatus as set forth in claim 4 including:
    stabilizer means selectively movable between one position disengaged from said arm and another position engaged with said arm at a location distant from said conveyor means for holding said arm substantially rigid when said agitation drive means is operated to reciprocate said spindle.

7. Apparatus as set forth in claim 4 wherein said resilient means includes:
    a coil spring coaxially received on said spindle and extending between said collar and one of said ear members.

8. Apparatus as set for in claim 1 including:
    an impact anvil movable between a retracted position and a advanced position;
    a radially extending lever integral with said spindle;
    pivot drive means engageable with said spindle for pivoting said rack on said spindle to a pre-strike position raised above said anvil, said pivot drive means selectively disengageable from said lever to allow said rack to swing downwardly to strike said anvil when said anvil is in the advanced position.

9. Apparatus as set forth in claim 8 wherein said support means includes:
    socket means mounting said rack on said spindle with freedom of movement within defined limits generally about the axis of said bearing means.

10. Apparatus as set forth in claim 9 wherein said rack and said spindle are generally coaxial and including:
    means preventing relative longitudinal movement between said rack and said spindle.

11. Apparatus as set forth in claim 8 including:
    a bracket integral with and extending outwardly from said arm;
    an impact drive spool fixed on said spindle;
    an impact drive spring extending between said bracket and said drive spool for rotating said spindle on said bearing means relative to said arm to cause said rack to swing downwardly to strike said anvil when said pivot drive means becomes disengaged from said lever.

12. Apparatus for solder leveling a circuitized substrate to produce substantially flush solder fill on pins recessed in the substrate comprising:
    support means including a rack mounted thereon for carrying at least one pin containing substrate;
    conveyor means operable for advancing said support means along a series of individual work stations at each of which is performed a discrete operation on the substrate, said conveyor means operable for interrupting movement of said rack means at each of the work stations to enable the discrete operation to be performed on the substrate;
    said support means including:
        an arm mounted at one end to said conveyor means and generally cantilevered outwardly therefrom so as to overlie a series of individual work stations at each of which can be performed at least one discrete operation on the substrate as it is advanced by said conveyor means;
        a spindle generally coextensive with said arm; and
        bearing means pivotally mounting said spindle on said arm;
    a vessel adapted to be filled with molten solder and positioned to receive said rack for immersion into the molten solder;
    an upright chimney positioned within said vessel having an open upper end, and a lower end positioned for immersion in the solder when said vessel is filled with molten solder, said upper end positioned to extend above the level of the molten solder;
    circulating pump means for causing flow of the solder from said vessel through said chimney and out through said upper end, then back into said vessel; and
wherein;
    said arm includes;
        a pair of transversely extending ear members at spaced apart locations; and
wherein:
    said spindle includes:
        a flange integral with one end thereof lying generally in a plane perpendicular to a longitudinal axis of said spindle; and
        a collar fixed on said spindle;
wherein:
    said agitation drive means includes:
        a coupling engageable with said flange when said arm is in the lowered position;
wherein:
    said bearing means includes:
        journals within each of said ear members; and
wherein:
    said apparatus includes:
        resilient means interposed between said collar and one of said ear members for biasing said spindle to a home position whereat said flange is aligned with said coupling for engagement therewith when said arm is in the lowered position.

13. Apparatus as set forth in claim 12 wherein:
    said agitation drive means is effective to move said spindle longitudinally at such an amplitude and frequency as to attain a maximum speed in the range of 10 to 50 inches per second.

14. Apparatus for applying a solder to a substrate temporarily mounted on a support member comprising:
    a vessel adapted to be filled with molten solder and positioned to receive the support member for immersion of the substrate into the molten solder;
    an upright chimney positioned within said vessel having an open upper end, and a lower end positioned for immersion in the solder when the vessel is filled with molten solder, said upper end positioned to extend above the level of the molten solder; and circulating pump means for causing flow of the solder from said vessel and out through said upper end, then back into said vessel; and agitation drive means for reciprocating the support member when the substrate is immersed in the molten solder at such an amplitude and frequency as to attain a maximum speed in the range of 10 to 50 inches per second.

15. A method for applying solder to a substrate temporarily mounted on a support member comprising the steps of:

providing an upright chimney positioned within a vessel filled with molten solder, the chimney having an upper end extending above the level of the molten solder;

causing flow of the molten solder from the vessel through the chimney and out through the upper end, then back into the vessel, such that dross and the like impurities form on the surface of the molten solder in the vessel but not on the surface of the molten solder at the upper end of the chimney;

immersing the substrate in the molten solder within the upright chimney for a predetermined period of time;

reciprocating the support member during the step of immersing the substrate in the molten solder at such an amplitude and frequency as to attain a maximum speed in the range of 10 to 50 inches per second; and withdrawing the substrate from the molten solder after lapse of the predetermined period of time.

* * * * *